United States Patent
Dekker et al.

(10) Patent No.: US 7,915,707 B2
(45) Date of Patent: Mar. 29, 2011

(54) DEFORMABLE INTEGRATED CIRCUIT DEVICE

(75) Inventors: Ronald Dekker, Eindhoven (NL); Antoon Marie Henrie Tombeur, Eindhoven (NL); Theodoros Zoumpoulidis, Delft (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 139 days.

(21) Appl. No.: 12/377,673

(22) PCT Filed: Aug. 7, 2007

(86) PCT No.: PCT/IB2007/053103
§ 371 (c)(1),
(2), (4) Date: Feb. 17, 2009

(87) PCT Pub. No.: WO2008/020361
PCT Pub. Date: Feb. 21, 2008

(65) Prior Publication Data
US 2010/0270640 A1    Oct. 28, 2010

(30) Foreign Application Priority Data
Aug. 14, 2006 (EP) ................................. 06118866

(51) Int. Cl.
*H01L 29/00* (2006.01)
(52) U.S. Cl. ................. 257/528; 257/531; 257/E25.029; 438/329; 438/381
(58) Field of Classification Search .................. 257/528, 257/531, E25.029; 438/329, 381
See application file for complete search history.

(56) References Cited

U.S. PATENT DOCUMENTS

| | | | |
|---|---|---|---|
| 4,587,719 A | 5/1986 | Barth | |
| 5,268,813 A | 12/1993 | Chapman | |
| 5,891,354 A | 4/1999 | Lee et al. | |
| 6,061,245 A | 5/2000 | Ingraham et al. | |
| 6,071,819 A | 6/2000 | Tai et al. | |
| 6,455,931 B1 | 9/2002 | Hamilton, Jr. et al. | |
| 6,479,890 B1 | 11/2002 | Trieu et al. | |
| 6,908,856 B2 | 6/2005 | Beyne et al. | |
| 6,953,982 B1 | 10/2005 | Tai et al. | |
| 2006/0078715 A1* | 4/2006 | Lu ................................. 428/209 |

FOREIGN PATENT DOCUMENTS

| | | |
|---|---|---|
| GB | 1048021 A | 11/1966 |
| GB | 2126802 A | 3/1984 |
| JP | 6036620 A | 2/1994 |
| WO | 2005122285 A2 | 12/2005 |

OTHER PUBLICATIONS

The Written Opinion of the International Searching Authority, PCT/IB2007/053103.

* cited by examiner

*Primary Examiner* — Tu-Tu V Ho (57) ABSTRACT

An integrated-circuit device includes a rigid substrate island having a main substrate surface with a circuit region circuit elements and at least one fold structure. The fold structure is attached to the substrate island and is unfoldable from a relaxed, folded state to a strained unfolded state. The fold structure contains at least one passive electrical component. The fold structure further has in its folded state at least one surface with an area vector that includes a non-vanishing area-vector component in a direction parallel to the main substrate surface, which area-vector component is diminished or vanishes when deforming the fold structure from the folded into the unfolded state.

18 Claims, 12 Drawing Sheets

DEFORMABLE INTEGRATED CIRCUIT DEVICE

FIELD OF THE INVENTION

The present invention concerns a deformable integrated-circuit device and a method for fabricating a deformable integrated-circuit device.

BACKGROUND OF THE INVENTION

Deformable integrated-circuit devices have attracted attention due to their ability to adapt to specific geometrical boundary conditions of the operating environment they are used in. For instance, unlike conventional rigid integrated-circuit devices, a deformable integrated-circuit may be bent for installation on a bent surface.

U.S. Pat. No. 6,479,890 discloses deformable integrated-circuit device, which comprises a plurality of substrate islands embedded in a flexible foil. Connection lines are arranged on the flexible foil for electrically connecting the substrate islands. Similarly, U.S. Pat. No. 6,953,982 B1 describes a deformable integrated-circuit device, which is formed of Silicon islands encapsulated in a polyimide film. For fabricating the Silicon islands, Silicon wafers are etched to a desirable thickness by wet etching and then patterned from the backside by reactive ion etching (RIE).

An deformable integrated-circuit device is known from U.S. Pat. No. 6,455,931 B1. A fold structure in the form of folded metal interconnects (conductor tracks) meandering in a plane parallel to the main substrate surface is provided for connecting neighboring substrate islands. This expandable structure is useful for increasing the area between individual circuit components when placing the device in its operating position. However, the meandering conductive track raises issues of mechanical stability during deformation, which increases the risk of unreliability, i.e. device failure. Stability therefore requires conductor tracks of sufficient width, which consume a rather large chip area during fabrication, and in consequence result in a rather expensive device.

SUMMARY OF THE INVENTION

It is therefore an object of the present invention to provide a deformable integrated-circuit device that has a fold structure, which can be fabricated with less chip-area consumption.

It is another object of the present invention to provide a method for fabricating a deformable integrated-circuit device that has a fold structure, which can be fabricated with less chip-area consumption.

According to a first aspect of the invention, an integrated-circuit device is provided, which comprises a substrate island having a main substrate surface with a circuit region circuit elements and at least one fold structure. The fold structure is attached to the substrate island and is unfoldable from a relaxed, folded state to a strained unfolded state. The fold structure contains at least one passive electrical component. The fold structure further has in its folded state at least one surface with an area vector that includes a non-vanishing area-vector component in a direction parallel to the main substrate surface, which area-vector component is diminished or vanishes when deforming the fold structure from the folded into the unfolded state.

The integrated-circuit device of the invention provides an improvement over known prior-art devices in that the fold structure, which is unfoldable from a relaxed, folded state to a strained unfolded state. Strain is a geometrical expression of deformation caused by an action of stress on the fold structure. The strain is a change in size and/or shape.

In the integrated-circuit device of the invention the fold structure has a surface with an area vector that includes a non-vanishing area-vector component in a direction parallel to the main substrate surface. An area vector is typically defined with respect to an infinitesimal surface element. If a surface is plane, the surface vector will be the same for all surface elements. The area vector of a surface element is a vector that is directed perpendicular to the surface element. The direction of the surface vector varies with an orientation of a particular surface element in space. If a surface is bent, the direction of the surface vectors of different respective surface elements of the surface will vary in dependence on an orientation of the respective surface element.

In the integrated-circuit device of the present invention, the fold structure has surface with a non-vanishing area-vector component that is directed parallel to a surface of the fold structure. That means, the surface is either oriented either inclined or perpendicular with respect to the main substrate surface. However, this area-vector component is either diminished or vanishes when deforming the fold structure from the folded into the unfolded state.

The mentioned surface of the fold structure in the folded state need not be a plane surface, it may also have curved sections, i.e., have changing area vectors in different surface elements in the folded state, or have a step-like profile. The fold structure may have additional surface sections with a vanishing area-vector component parallel to the main substrate surface.

The fold structure provided by the present invention allows fabricating the integrated-circuit device with small lateral extensions and thus takes up a particularly small amount of chip area, which reduces the cost per device.

The fold structure of the integrated-circuit device of the present invention includes at least one passive electrical component. A passive electrical component is for example a conductor like an interconnect line, or a capacitor, or an inductor.

In the following, preferred embodiments of the integrated-circuit device of the invention will be described. The embodiments can be combined with each other unless stated otherwise explicitly.

In a group of alternative embodiments, the fold structure, in its folded state, has a section that resembles either the letter U or the letter V, each in either upright or inverted form. Thus, this group comprises four alternative embodiments.

In a first pair of embodiments of this group, the fold structure, in a cross sectional view, resembles an upright or inverted letter U. The letter U has two vertical lines connected by an arc section. However, useful variations from this pure U-shape comprise a cross-sectional profile that instead of the arc section contains a straight line, or a cross-sectional profile that instead of vertical side lines contains inclined lines, or step profiles. These variations are summarized as resembling the letter U.

In a second pair embodiments of this group, the fold structure, in a cross-view, has a profile that resembles the letter V in either upright or inverted form. The letter V is formed by two inclined straight lines that end at a common point of intersection. However, useful variations from this pure V-shape are possible. For instance, the straight lines may be replaced by a step profile. Furthermore, the straight lines may be inclined but not intersect, which then forms a profile that is an intermediate between the letters U and V.

Other variations of these cross-sectional profiles of the fold structure are possible and can easily be designed by a person of ordinary skill in the art.

A further preferred embodiment of the integrated-circuit device of the invention, the fold structure comprises a conductor track that is embedded in an elastically deformable material. The conductor track can form a part of a passive electrical component. An elastic deformation is a reversible change in shape with respect to the folded, relaxed state as a consequence of an application of stress. Such stress may, without limitation, be tensile (pulling), compressive (pushing), sheer, bending or twisting (torsion). When the application of stress stops, an elastically deformable connection returns to its original shape.

Note that the invention does not exclude a plastic deformation of the fold structure, which is a non-reversible deformation. Plastic and elastic deformability typically coexist and apply in different stress regions. A plastic deformability of the fold structure may form a useful contribution to the mechanical properties of the fold structure. For instance, the elastically deformable material may be inelastically deformable when subjected to a stress that exceeds a threshold stress amount.

In a further embodiment, the conductor track is arranged in a neutral line of the fold structure with respect to a deformation from the folded to the unfolded state. In this embodiment, the conductor track is exposed to the minimum possible amount of strain during unfolding. This way, the conductor track, which is typically made of a metal, is saved from as much strain as possible, which increases the live time and reliability of the conductor track, and thus of the integrated-circuit device.

In a further preferred embodiment, the fold structure is a free-standing fold structure. That means that the fold structure, except for its ends, is not fixed to a surface. No fixation is provided in intermediate regions. This embodiment is particularly useful for making an unfolding of the fold structure easier.

In one preferred embodiment, the fold structure connects the substrate island and an antenna with each other. This embodiment forms an application case of the invention in the field of wireless communication. For instance, wireless sensors or RFID tag devices can make use of the present invention. A useful application is for instance also formed by a pressure sensor that can be connected with an implantable stent and communicates with the outside world after implantation and expansion of the stent via an on-chip antenna.

One embodiment has fold structures attached to the substrate island on four lateral sides. Neighboring lateral sides in this embodiment are preferably at an angle of 90° to each other. The integrated-circuit device of this embodiment is unfoldable for an extension in all four directions. Note, however, that the substrate island need not be rectangular. Other shapes, such as circular or hexagonal, octagonal, etc. are possible as well.

A useful intermediate product that makes handling of the integrated circuit device easier before placing the device in its operating position has the integrated circuit device mounted onto a temporary carrier. This intermediate product makes transporting and handling of the device possible without risking structural failures due to stress exerted during the transportation or handling.

The following paragraphs of the description turn to the method aspect of the invention.

According to a second aspect of the present invention, a method for fabricating an integrated-circuit device is provided. The method comprises the steps of:

providing a substrate having a main substrate surface that comprises at least one circuit region with circuit elements;

fabricating a template structure on the main substrate surface outside the circuit region, the template structure having at least one surface with an area vector that includes a non-vanishing area-vector component in a direction parallel to the main substrate surface;

depositing an etch stop layer on the template structure, the etch stop layer withstanding an agent suitable for removing material of the substrate;

fabricating a conductor track on top of the etch stop layer;

depositing a first deformable material layer on a first conductor track surface;

mounting the substrate onto a temporary carrier, the template structure facing the temporary carrier;

forming a substrate island in the circuit region and removing the substrate from a back face opposite to the side of the temporary carrier up to the etch stop layer and;

selectively removing the etch stop layer, thus exposing the conductor track;

depositing a second deformable material layer on a second conductor track surface;

removing the temporary carrier.

The method of the invention provides for a fabrication of a relaxed fold structure by preparing a template structure on the main substrate surface outside the circuit region. Like the desired fold structure, the template structure has at least one surface with an area vector that includes a non-vanishing area-vector component in a direction parallel to the main substrate surface.

For preparation of the fold structure it is of high importance that an etch stop layer is deposited on the template structure. The etch stop layer is suitable for withstanding an agent that removes material from the substrate. That means, the etch stop layer allows a selective removal of the substrate from the backside up to the template structure. Therefore, the fold structure is prepared by structuring the substrate from the front side and from the back side.

The method of the invention enables low-cost macro-electronic applications fabricated in high-performance mainstream silicon integrated-circuit processes.

In the following, preferred embodiments of the method of the second aspect of the invention will be described. Embodiments of the method of the invention described hereinafter can be combined with each other, unless stated otherwise explicitly.

In a group of alternative embodiments, which in its structural aspects has been described in detail with reference to the integrated-circuit device of the invention, the step of fabricating a template structure comprises etching a trench in the shape of either the letter U or the letter V into the main substrate surface. For obtaining profiles of the inverted letters U or V of the fold structure, an elevated template structure on the substrate surface is preferably fabricated.

The fold structures is preferably designed so as to limit stress on the fold structures after unfolding.

In embodiments that use fold structures with suitably small lateral extensions, it is advantageous to seal a trench formed during fabrication of the template structure before mounting the substrate onto a temporary carrier. This way, an intrusion of the adhesive material used for mounting the temporary carrier is avoided, which simplifies later processing after removal of the temporary carrier. The sealing of the trench is not necessary where the trench has a lateral width that makes removal of the adhesive material a simple process.

In a further embodiment, after the step of sealing the trench before the step of mounting the substrate onto the temporary carrier, a step of depositing a separator layer on the substrate, including the sealing portions, is performed. This way, the later separation of the temporary substrate from the processed device is facilitated.

Preferably, the separator layer and the trench sealing are removed after the step of removing the temporary carrier.

In a further embodiment, the step of mounting the substrate onto the temporary carrier comprises depositing and planarizing an adhesive layer on the main substrate surface and in the trench.

BRIEF DESCRIPTION OF THE DRAWINGS

The invention will now be explained in more detail with reference to the drawings in which.

DETAILED DESCRIPTION OF EMBODIMENTS

FIGS. 1-10 show different stages during the fabrication of an unfoldable integrated-circuit device 100 according to a first embodiment of the invention.

The description of the integrated-circuit device according to the present embodiment of the invention starts with a processed CMOS or BiCMOS wafer 102, which has been processed according to a desired application. Typically, the wafer contains 102 a large number of integrated-circuit devices 100. The application may for instance require an RFID tag circuit, a controller circuit for a wireless flow sensor, an implantable pressure sensor for bio-medical applications, a transmitter controller circuit, a receiver controller circuit, a transceiver controller circuit, or the like.

Figure 1:
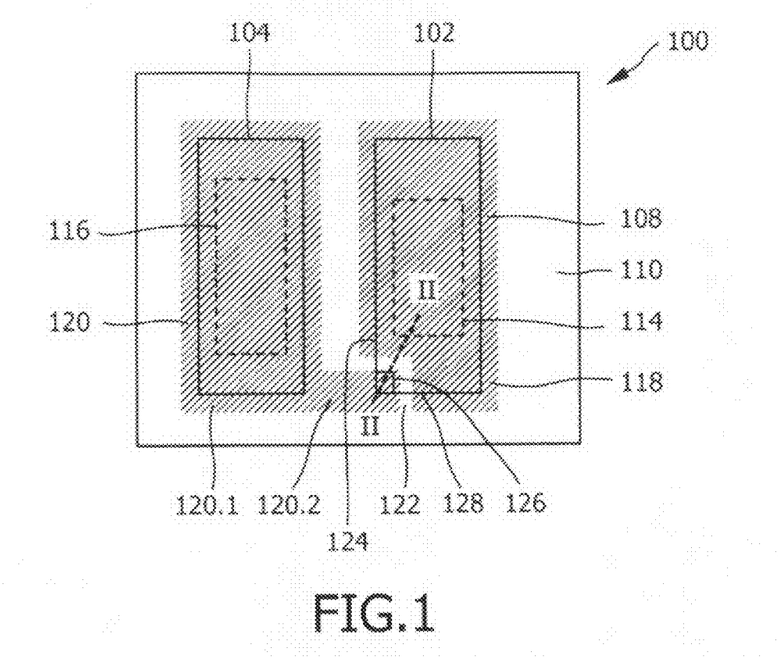
FIGS. 1-10 show schematic cross-sectional views of an unfoldable integrated-circuit device at different stages during the fabrication of the integrated-circuit device, according to a first embodiment of the invention.
Figure 2:
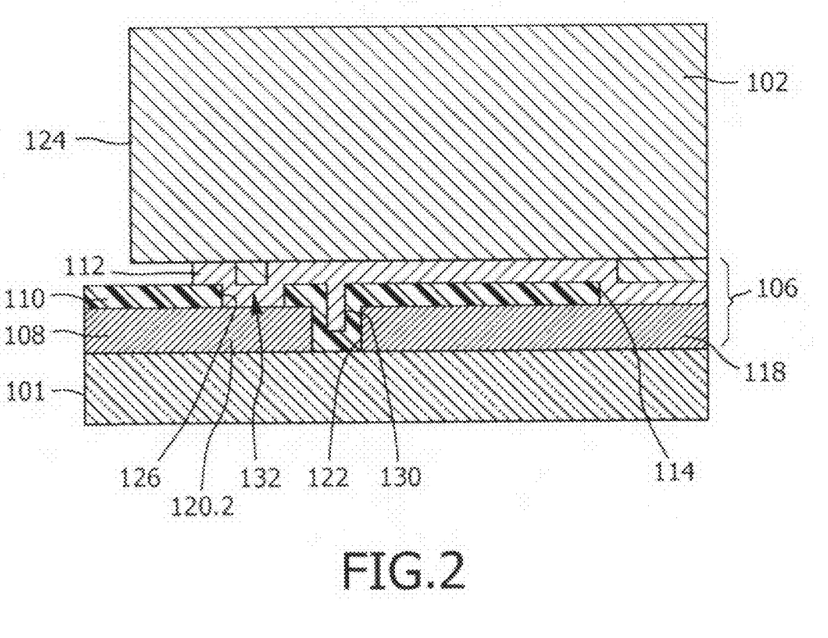

In FIG. 1, an application circuit is shown at reference label 104. For the following description it shall be assumed that application circuit 104 forms an RFID tag circuit. Two sections 106 and 108 of an antenna are shown at reference labels 106 and 108. The antenna is arranged in the outer regions of the integrated-circuit device 100. Note that the integrated-circuit device 100 is formed on a silicon substrate 110, which forms a section of the silicon wafer 102 during present processing step and will be separated from the wafer during later processing stages, which are not shown here. Field oxide layer 112 electrically isolates RFID tag circuit 104.

At the point of processing shown in FIG. 1, silicon substrate 110 forms a substrate with a main substrate surface 114, which comprises the RFID circuit 104. Of course, other electronic circuits may be provided in addition to RFID tag circuit 104.

Note that the cross-sectional view of FIGS. 1-10 is schematic. It does not show any details of the RFID tag circuit 104, nor does it show an interconnect structure, which is processed up to the final interconnect layer before the processing of the present embodiment starts.

The processing then continuous with the fabrication of a template structure on the main substrate surface outside the circuit region formed by RFID tag circuit 104. First, openings 116 and 118 are fabricated in the field oxide layer 112 in regions, where the template structures are to be formed, cf. FIG. 2.

Figure 3:
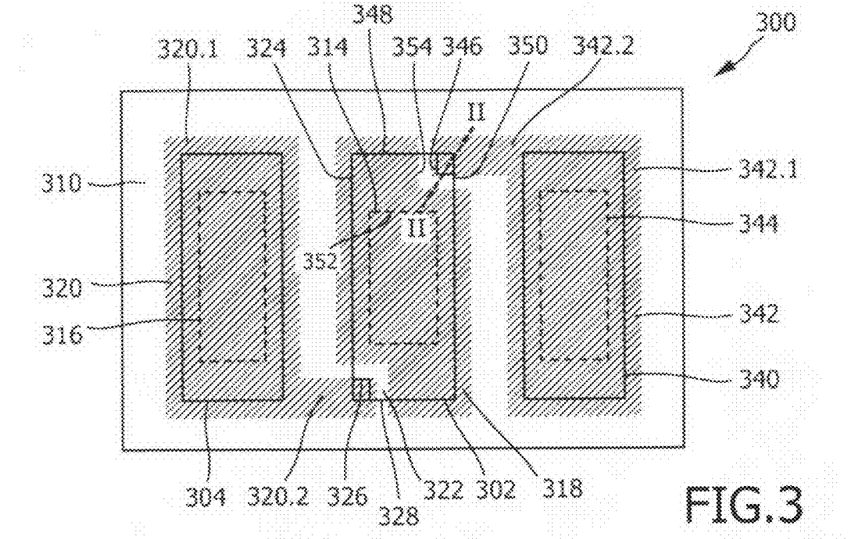

In a next step, the template structures are formed by anisotropic etching of V-shaped trenches in the openings 116 and 118. The field oxide layer 112 thus serves as a hard mask during this step. The V-shaped trenches 120 and 122 have sidewalls 120.1, 120.2, and 122.1, 122.2, which are inclined at an angle of approximately 54.7° with respect to a horizontal line 124, which is parallel to the main substrate surface 114 and intersects the bottom of the V-shaped trenches. A suitable etchant for fabricating the V-shaped trenches 120 and 122 is potassium hydroxide KOH.

The result of this processing is shown in FIG. 3. Note that the surfaces 120.1, 120.2, 122.1, and 122.2 have surface vectors, which have an area vector that includes a non-vanishing vector component in a direction parallel to the main substrate surface 114. This is indicated by an exemplary area vector V shown at the surface 122.1 of V-shaped trench 122. The area vector V obviously has two components $V\|$ and $V\perp$.

Figure 4:
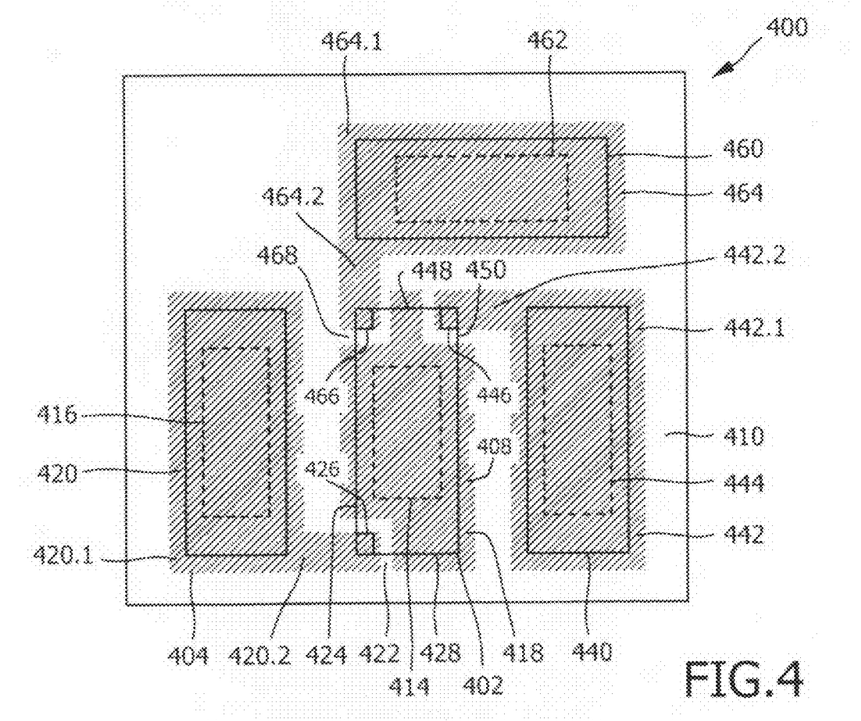

In the following, an etch stop layer 126 is deposited on the main substrate surface 114 and on the surfaces 120.1, 120.2, 122.1, and 122.2 of the V-shaped trenches 120 and 122. The etch stop layer is suitably selected for withstanding a KOH etch step, which is performed during a later processing step described below. If again KOH will be used for that later etching step, which is an advantageous option, silicon nitride is an example of a suitable etch stop material that can be used for etch stop layer 126. A silicon nitride layer can for instance be deposited by plasma-enhanced chemical vapor deposition (PECVD).

Furthermore, a conductor track 128 is formed on the etch stop layer 126. The conductor track 128 is made from a metal, e.g., Copper (Cu) or Aluminum (Al), and connects the RFID tag circuit 104 with the antenna sections 106 and 108. Since the etch stop layer 126 has also been deposited in the regions of the antenna, suitable structuring of the etch stop layer 126 and via formation is performed for connecting the conductor track 128 with the antenna sections 106 and 108. The result of this processing step is shown in FIG. 4.

Figure 5:
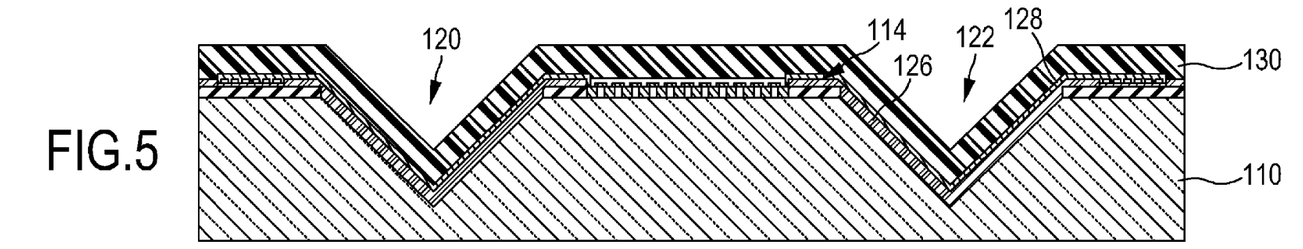

Turning to FIG. 5, the processing continues with a conformal deposition of a first elastomeric layer 130 on the main substrate surface 114 and in the trenches 120 and 122. The first elastomeric layer 130 is made from an electrically insulating elastomer. An example is parylene-n. The thickness of this first deformable material layer is chosen suitable for providing structural support and deformability in the finished unfoldable integrated-circuit device. A suitable thickness of this first deformable material layer, which is formed by the parylene-n layer 130, is 5 μm.

Note that there is no strict requirement of conformality of elastomer deposition in the trenches 120 and 122. The thickness of the elastomeric layer 130 may be somewhat larger in the trenches 120 and 122 than on the remaining portions of the substrate surface 114.

Figure 6:
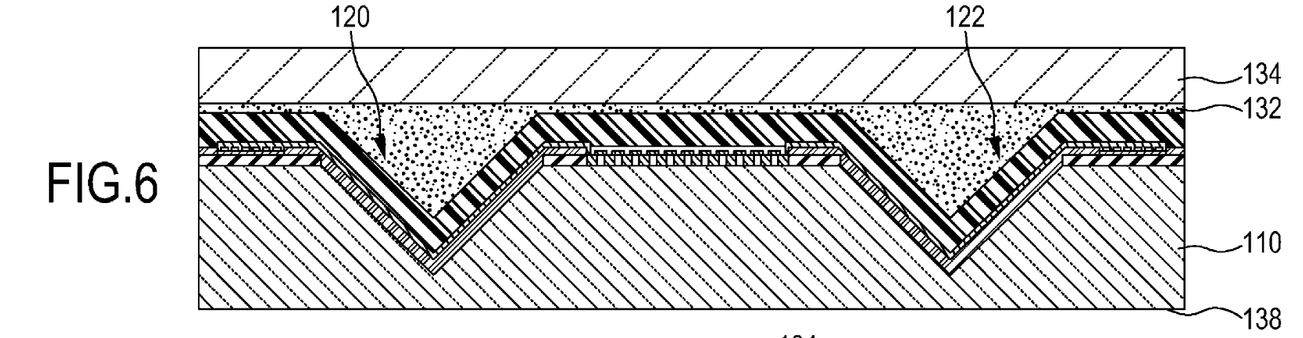

Turning now to FIG. 6, an adhesive layer 132 is deposited on the substrate surface and in the trenches 120 and 122, followed by a step of mounting the substrate onto a temporary glass carrier 134. The template structure formed by the V-shaped trenches 120 and 122 faces the temporary glass carrier 134.

Figure 7:
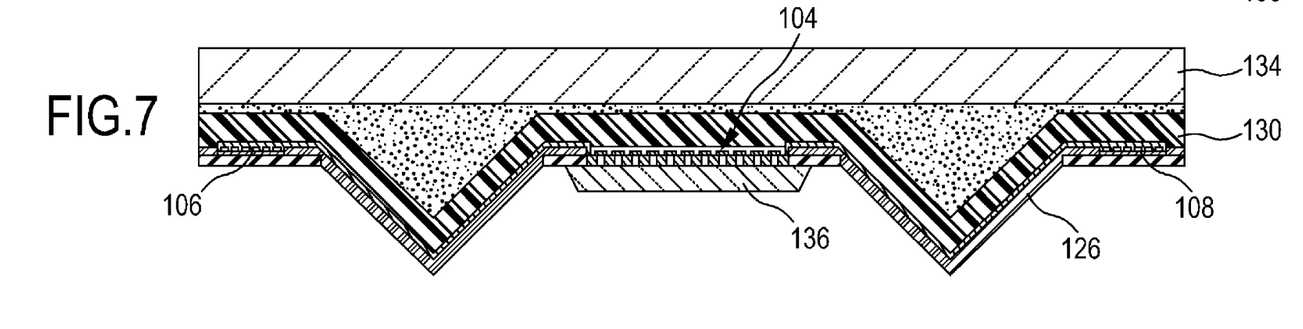

Subsequently, a back face 138 of the substrate is exposed to an etchant for removing the substrate 110 and for formation of a substrate island 136 underneath the circuit region formed by the RFID tag circuit 104. The etching stops at the etch stop layer 126 and at portions of the field oxide layer 112 underneath the antenna sections 106 and 108. The substrate islands formed in this processing step are preferably rigid. in comparison to the fold structure formed later on from the template structure. Silicon is sufficiently rigid from a thickness of about 30 micrometer on.

However, during island formation the substrate may in some embodiments be thinned down to a thickness below 30 micrometer. The substrate islands may thus be deformable in some embodiments, where operation and fabrication conditions allow such a low thickness.

Figure 8:
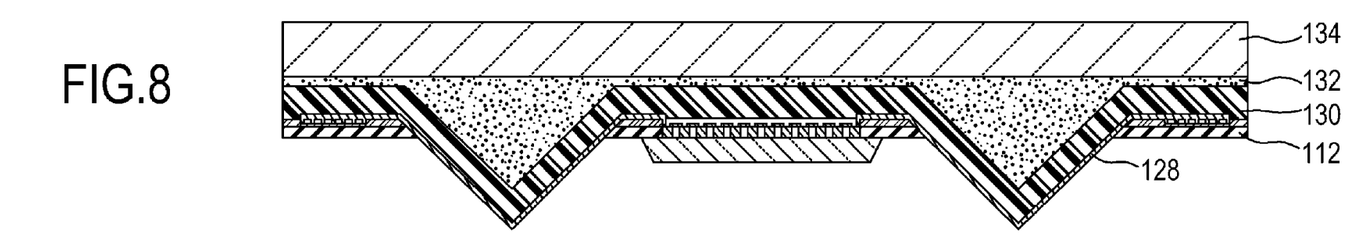

In a next step, the result of which is shown in FIG. 8, the etch stop layer 126 is removed from the conductor track 128.

Figure 9:
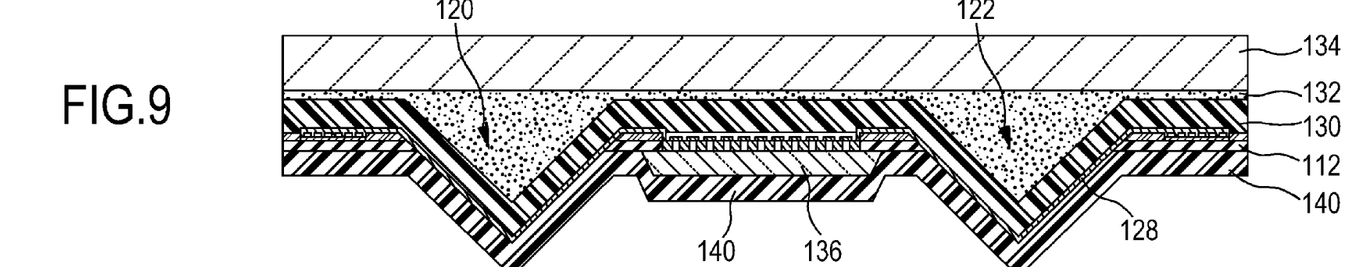

Turning now to FIG. 9, a second deformable material layer in the form of a second elastomer layer 140 is deposited on the bottom face of the substrate formed by the conductor track 128, the field oxide regions 112 and the substrate island 136. The second elastomer layer 140 is preferably formed by the same material as the first elastomer layer 130. It preferably also has the same thickness as the first elastomer layer 130, thus placing the conductor track 128 in the neutral line with respect to later strain generated in the fold structures formed by the sequence of the first elastomeric layer 130, the conductor track 128 and the second elastomeric layer 140 in the regions of the V-shaped trenches 120 and 122.

Figure 10:
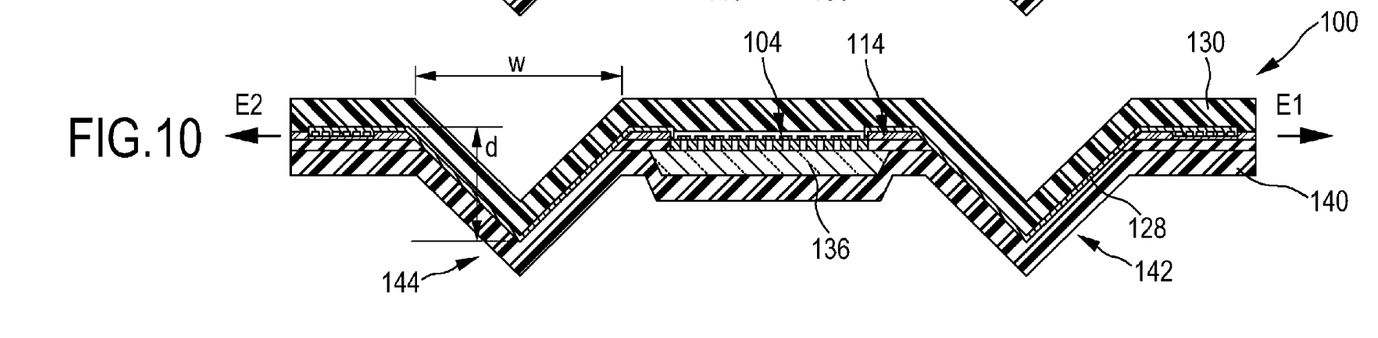

Finally, the temporary glass carrier 134 is removed, along with the adhesive layer 132. The resulting final device structure is shown in FIG. 10. It forms an integrated-circuit device 100 with a rigid substrate island 136 that has a main substrate surface 114, a circuit region that contains the RFID tag circuit 104 and two fold structures 142 and 144. After the processing of the present embodiment, the fold structures 142 and 144 are in a relaxed, folded state. By expanding the integrated-circuit device in directions indicated by the two arrows E1 and E2, the fold structures 142 and 144 can be unfolded into a strained unfolded state. The conductor track 128 forms a passive electrical component. Instead of a conductor track, the fold structures may also contain inductor or capacitor structures. Of course, a combination of different passive electrical components can also be integrated into a fold structure. By expanding the fold structures, the V-shape of the fold structures 142 and 144 is "flattened", thereby diminishing the area-vector component, which is directed parallel to the main substrate surface 114.

The fabrication of the integrated-circuit device 100 with the fold structures 142 and 144 allows an expansion by about a factor 3. This can be easily deduced from the following geometrical considerations: assuming that the V-shaped trenches 120 and 122 have a width w and a depth d (cf. FIG. 10), the length of the folded conductor track 128 in the V-shaped trench 122 of the fold structure 144 is given by the following formula:

$$L = 2\sqrt{d^2 + (0.7d)^2} = 2.44d$$

Considering that the width w can be expressed as $$w = 2(0.7d) = 1.4d,$$

the elongation of the fold structure that can be achieved is 2.44/1.4=1.74, resulting in an extension ratio (formed by the square of the elongation) of 3.03. The above calculation applies for the present embodiment, which uses an angle of 54.7° of the V-shaped fold structure, as indicated in FIG. 3.

FIGS. 11-24 how different stages during the fabrication of an unfoldable integrated-circuit device 200 according to a second embodiment of the invention. For reasons of simplicity, the present embodiment uses the same exemplary application, i.e., an RFID tag circuit 204, that is to be connected to antenna sections 206 and 208 by a fold structure.

Figures 11, 12:
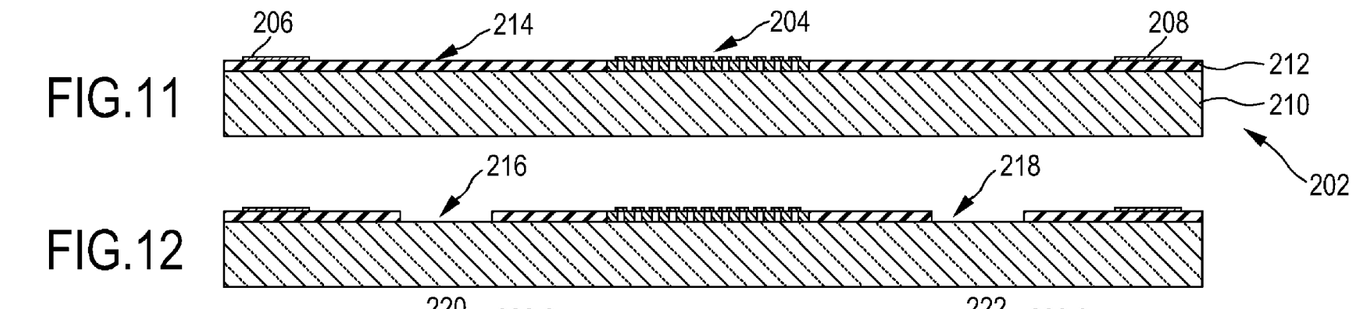
FIGS. 11-24 show schematic cross-sectional views of an unfoldable integrated-circuit device at different stages during the fabrication of the integrated-circuit device, according to a second embodiment of the invention.

At the initial point of processing, as in the previous embodiment, a silicon substrate 210 forms a rigid substrate with a main substrate surface 214. The processing begins with the formation of openings 216 and 218 in the field oxide layer 212. The openings are made by known processing techniques in those regions of the main substrate surface 214, where the template structures are to be formed.

Figure 13:
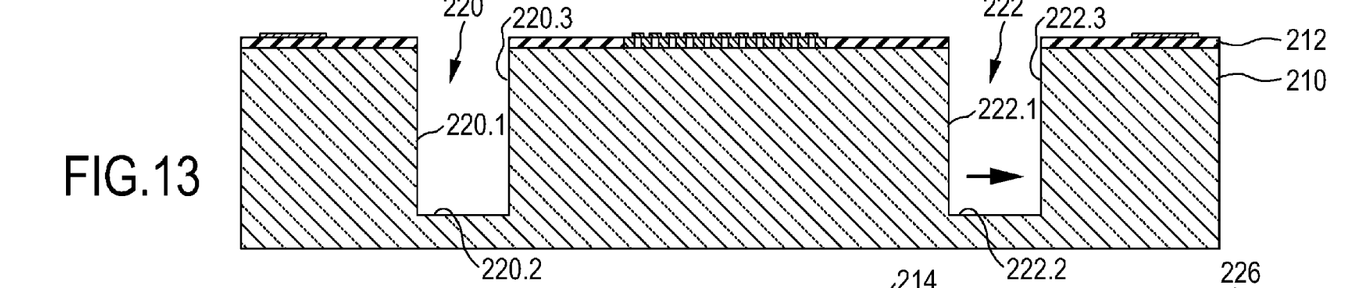

Referring now to FIG. 13, trenches 220 and 222 are then formed by an etching step. A suitable etching technique to be used in this step is reactive ion etching. The trenches 220 and 222 are between 100 and 200 μm deep. The width is chosen suitable for allowing a later deposition of an elastomeric layer in a conformal or nearly conformal manner. In the present embodiment, the width of the trenches 220 and 222 is approximately 50-100 μm. Note that these are exemplary values.

The trenches 220 and 222 thus form template structures on the main substrate surface 214, which have surfaces 220.1, 220.2, 220.3, and 222.1, 222.2, 222.3. The cross-section of the trenches 220 and 222 is rectangular. A rectangular cross-sectional profile as shown in FIG. 13 is a particular embodiment of a U-shaped cross-sectional profile of a template structure. The sidewalls 220.1, 220.3, 222.1, and 222.3 form surfaces of the template structures, which have area vectors with a non-vanishing area-vector component in a direction parallel to the main substrate surface. As an exemplary area vector, an area vector U is shown emerging from the surface of sidewall 222.1 of the trench 222.

Figure 14:
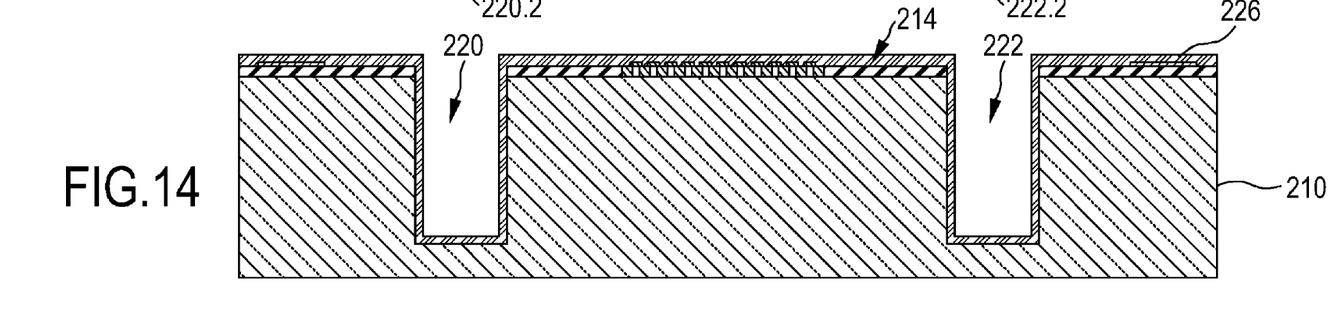
Figure 15:
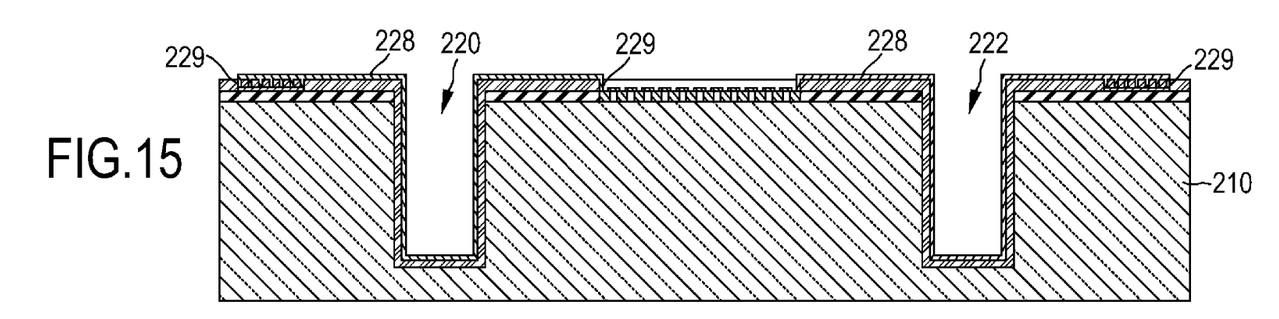

In a subsequent step, the result of which is shown in FIG. 14, an etch stop layer 226 is deposited in the trenches and on the main substrate surface. For details of the etch stop layer deposition, reference is made to the description of the corresponding step in the previous embodiments in the context of FIG. 4.

Subsequently, a conductor track 228 is deposited on the main substrate surface 214, covering the etch stop layer 226 on the main substrate surface 214 and in the trenches 220 and 224. For connection to the RFID tag circuit 204 and the antenna sections 206 and 208, conduction vias 229 are fabricated during this processing step, cf. FIG. 15.

Figure 16:
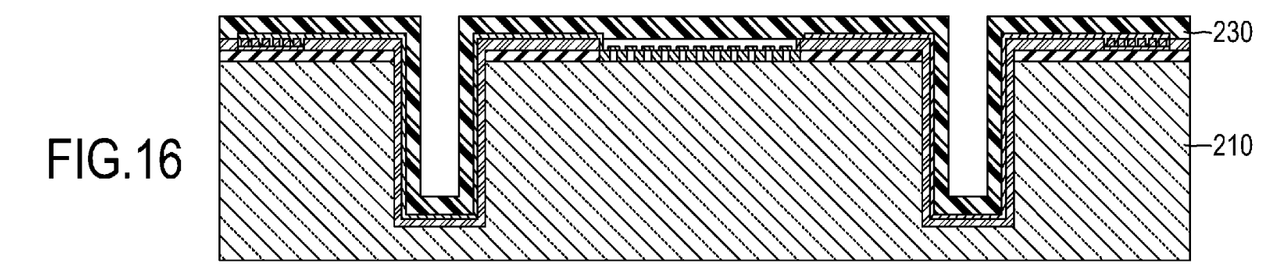

Referring now to FIG. 16, a first elastomer layer 230 is conformally deposited on the main substrate surface 214. As mentioned before, conformality is not to be interpreted as a strict requirement for deposition in the trenches.

Figure 17:
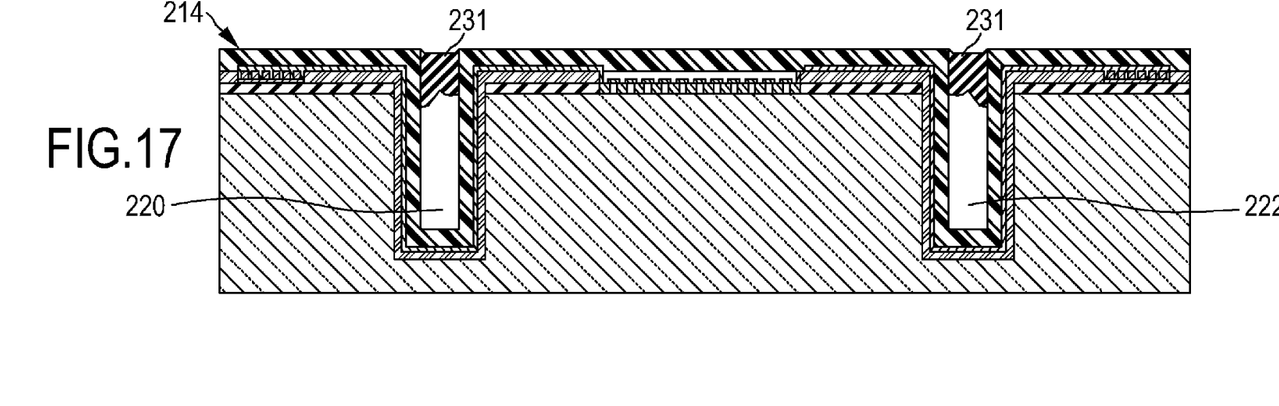

Next, a temporary sealing 231 is applied to the trenches 220 and 222. The temporary sealing 231 is applied by spinning a layer (not shown) of PMMA (Polymethylmethacrylate) onto the substrate surface, and a subsequent etching step that removes the PMMA layer from all portions of the main substrate surface 214 except for the trenches 220 and 222. The result of this processing is shown in FIG. 17.

Figure 18:
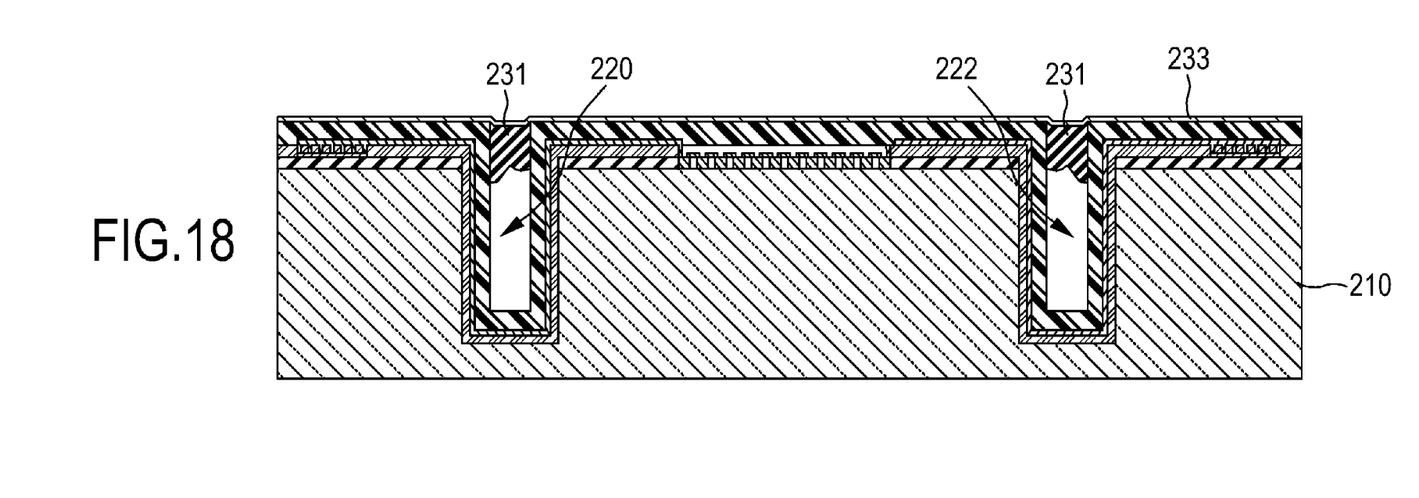

The application of the PMMA temporary sealing allows sparing the trenches 220 and 222 from a subsequent deposition of a separator oxide layer 233. Instead, the separator oxide layer 233 is deposited on the main substrate surface portions and on the top face of the temporary sealing 231. The separator oxide layer 233 has a thickness of 0.5 μm in one embodiment and is preferably deposited by plasma-enhanced chemical vapor deposition (PECVD) at a temperature of 250° C.

Figure 19:
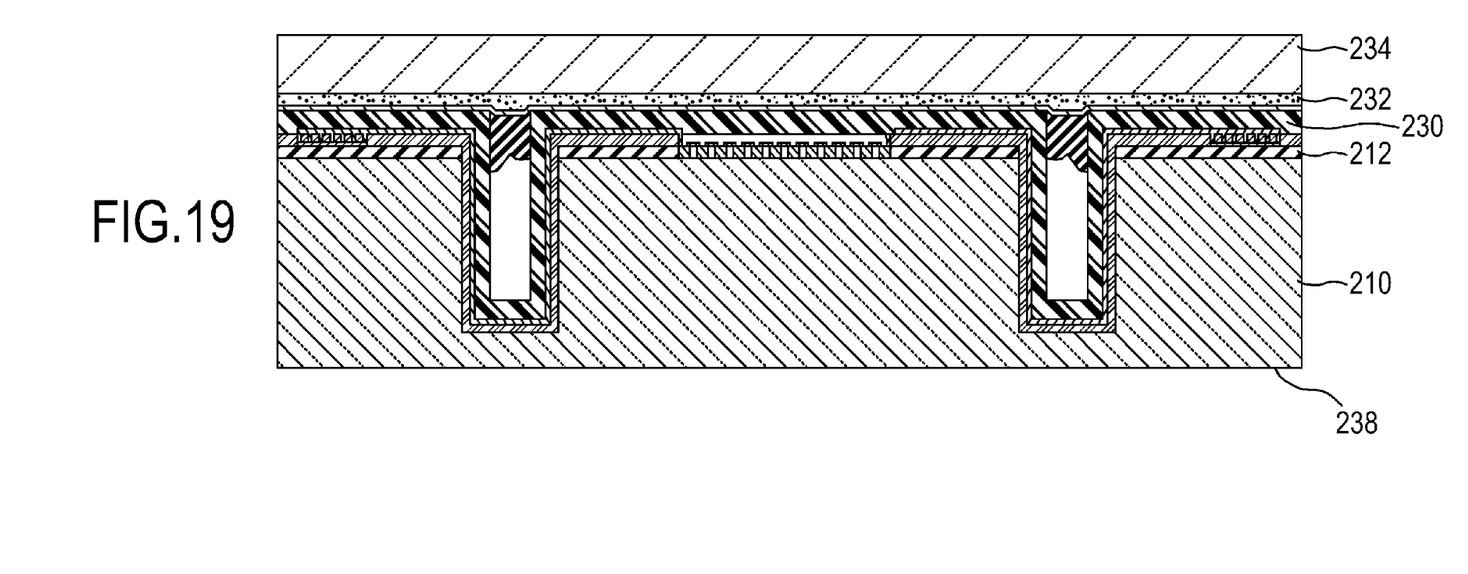

In the following, as shown in FIG. 19, the substrate 210, processed this way, is mounted onto a temporary glass carrier 234, using an intermediate adhesive layer 232 that has been deposited on the separator oxide layer 233.

Other carrier materials can be used instead of a glass carrier. An example of a suitable material is a ceramic material.

Figure 20:
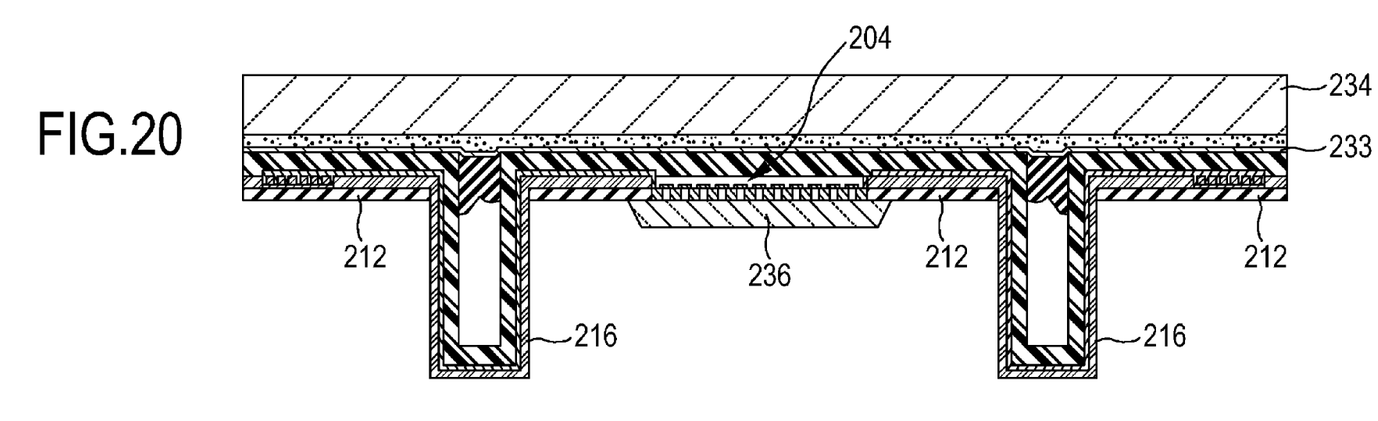
Figure 21:
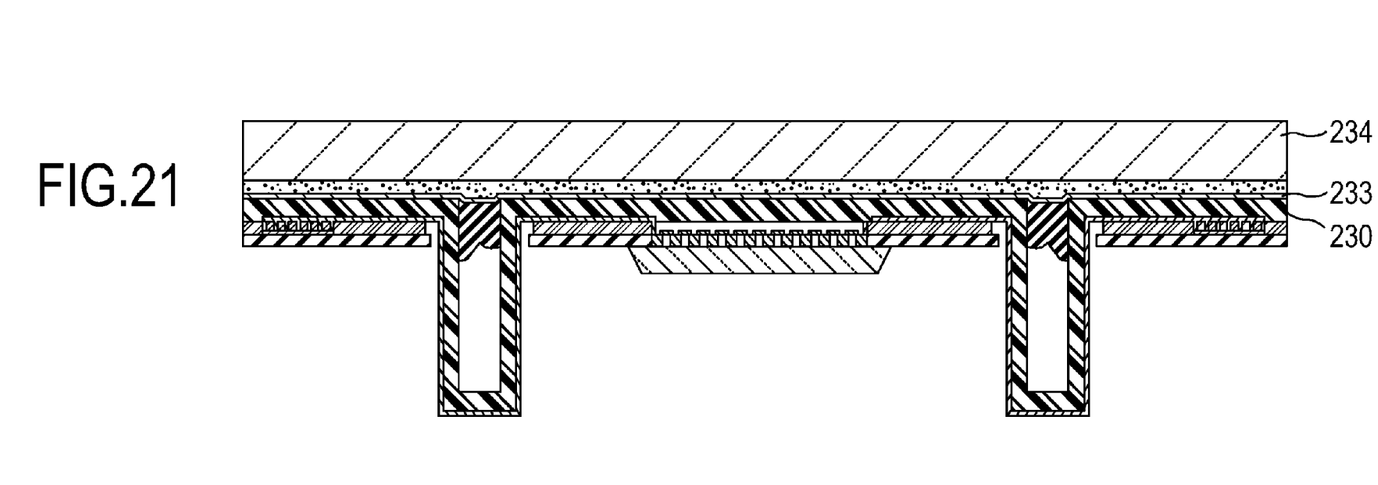

Referring now to FIG. 20, the substrate 210 is removed from its back surface 238 up to the etch stop layer 216 and to the field oxide layer 212, leaving only a substrate island 236 underneath the circuit regions formed by the RFID tag circuit 204. The processing for this step resembles that described with reference to FIG. 7 in the previous embodiment.

Figure 22:
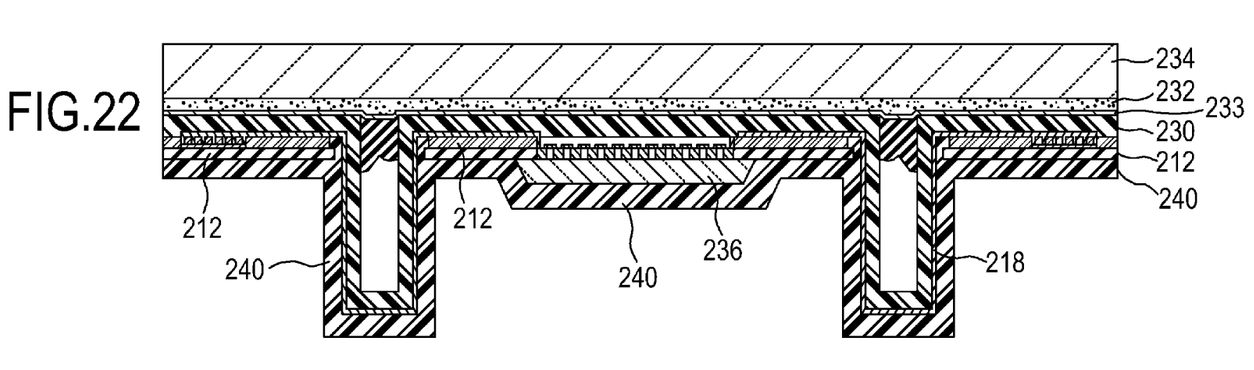
Figure 23:
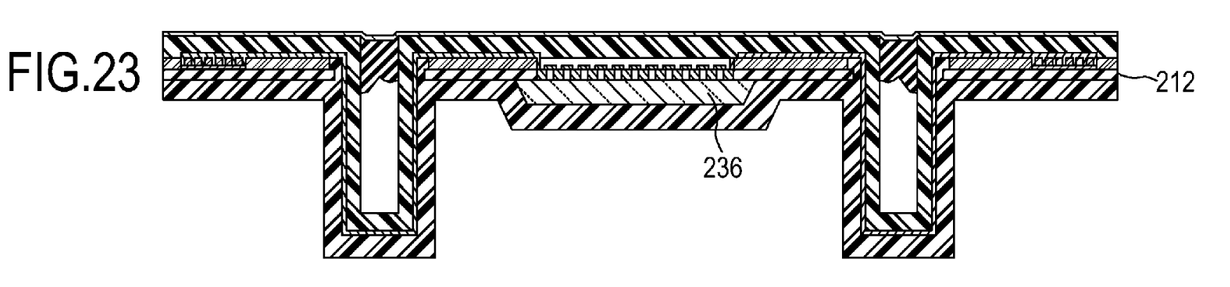
Figure 24:
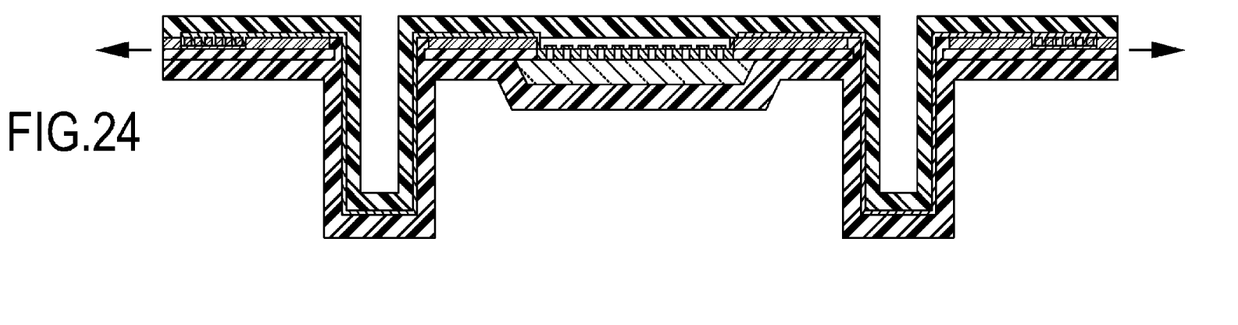

Subsequently, the etch stop layer 216 is removed by a separate etching step (cf. FIG. 21) and a second elastomer layer 240 is deposited on the back surface side, thus covering the conductor track 218, the field oxide regions 212 and the substrate island 236. The result of this processing is shown in FIG. 22. Regarding the thickness of the second elastomer layer 240, reference is made to corresponding explanations made with reference to FIGS. 9 and 10 of the previous embodiment. This way, fold structures 242 and 244 in the form of a rectangle are fabricated.

Subsequently, the integrated-circuit device is delaminated from the temporary glass carrier 234 at the interface between the separator oxide layer 233 and the adhesive layer 232. The separator oxide layer 233 and the temporary sealing 231 are then removed by a wet-etching and a subsequent annealing of the structure at 300° C. in an inert ambient atmosphere. This results in the final device structure shown in FIG. 24, which is ready for unfolding.

FIGS. 25-33 show different stages during the fabrication of an unfoldable integrated-circuit device according to a third embodiment of the invention.

Figure 25:
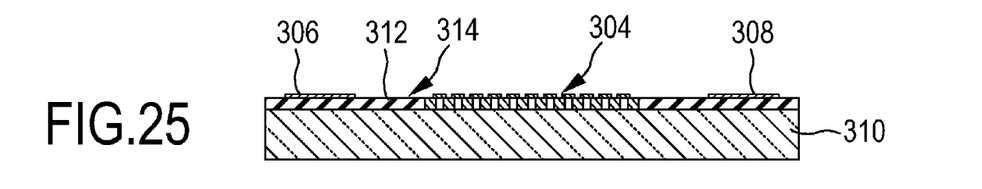
FIGS. 25-33 show schematic cross-sectional views of an unfoldable integrated-circuit device at different stages during the fabrication of the integrated-circuit device, according to a third embodiment of the invention.

The processing starts from a fully processed CMOS wafer with an integrated-circuit device 304 on a silicon substrate 310, cf. FIG. 25. For simplicity, the same exemplary device structure as before is used in the present embodiment. It thus contains an RFID tag circuit 304 and antenna segments 306 and 308 on a field oxide layer 312.

Figure 26:
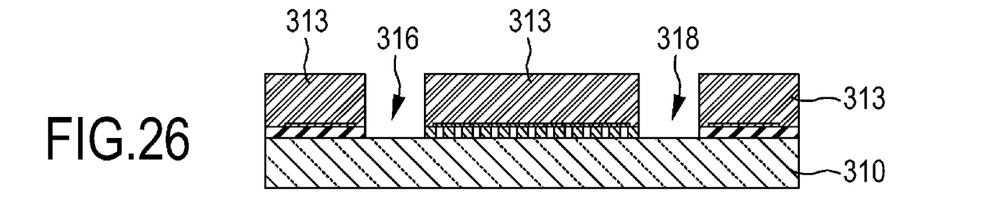

Subsequently, openings 316 and 318 are fabricated in the field oxide layer 312 after deposition of a mask layer 313, cf. FIG. 26.

Figure 27:
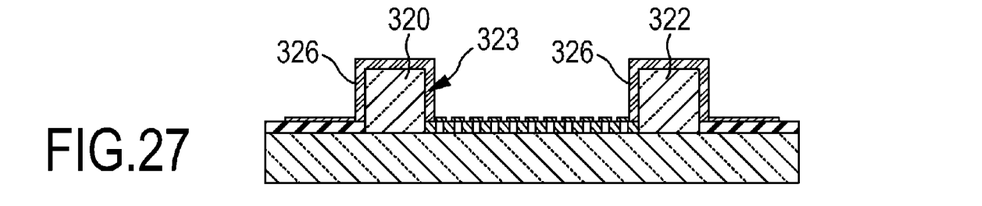

Turning to FIG. 27, two template structures 320 and 322 are then fabricated in the openings 316 and 318. The template structures 320 and 322 are in one embodiment made of a resist material, such as solder resist or photoresist. Alternatively, a polyamide or silicon dioxide can be used. It is also possible to deposit metal template structures, which has the advantage of allowing particularly low processing temperatures using an electroplating technique. In a further alternative embodiment, silicon, or more generally, the same material as the material of substrate 310 is used.

After removal of the mask layer 313, an etch stop layer 323 is deposited on the substrate surface including the template structures 320 and 322. The etch stop layer is selectively removed from surface regions other than the template structures 320 and 322.

Figure 28:
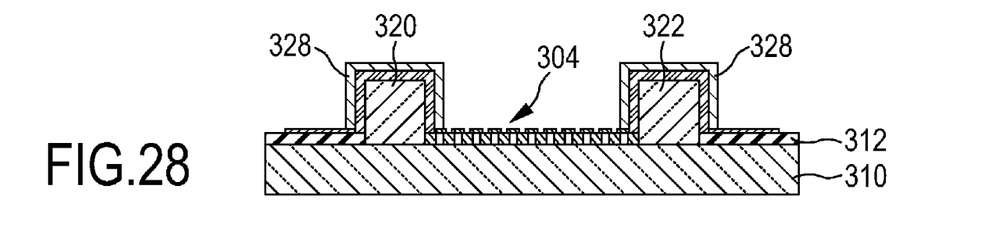

As can be seen in FIG. 28, a conductor track 328 is subsequently deposited on the substrate surface 314, connecting the RFID tag circuit 304 with the antenna sections 306 and 308, and covering the template structures 320 and 322.

Figure 29:
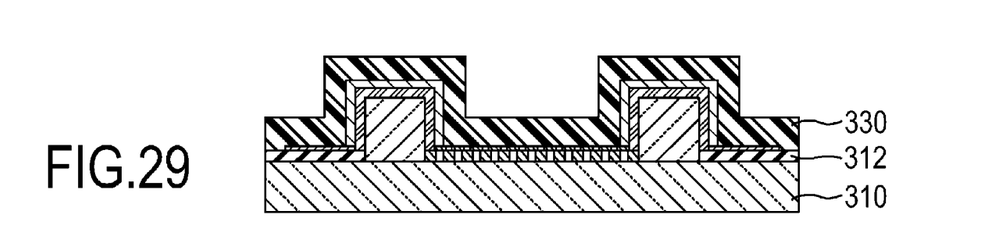

Turning now to FIG. 29, a first elastomer layer 330 is deposited on the first substrate surface 314 in a conformal or nearly conformal manner. Subsequently, the substrate 310 processed in this manner is mounted onto a temporary glass carrier 334, making use of an adhesive layer 332.

Figure 30:
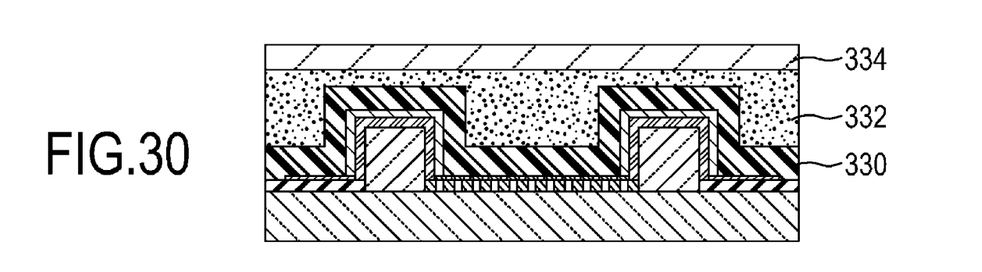

Next, the substrate 310 is etched from the backside up to the field oxide layer 312 and to the etch stop layer 323, which was deposited on the template structures earlier, cf. FIG. 30. The template structures 320 and 322 are therefore removed in the present processing step. This way, fold structures 342 and 344 in the form of a rectangle but with inverted orientation in comparison with the second embodiment, are fabricated. Depending on the material combination used for the substrate and the template structures, this processing step may require only one etching step or a plurality of etching substeps for removing different materials.

Figure 31:
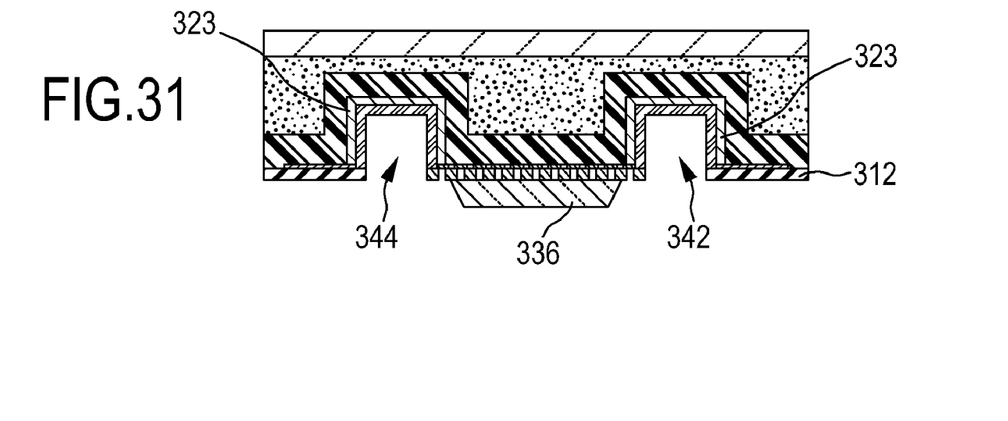
Figure 32:
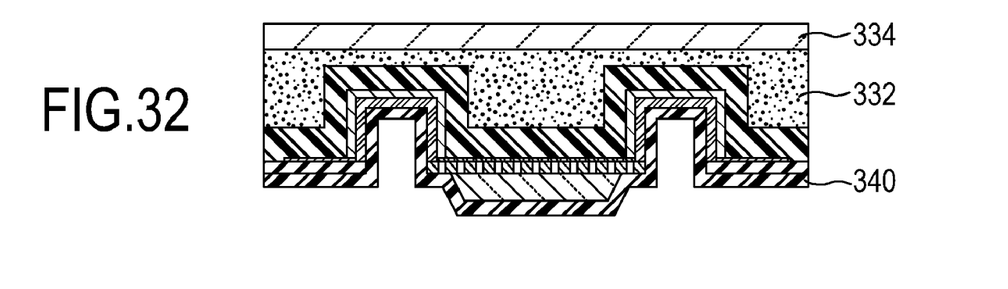
Figure 33:
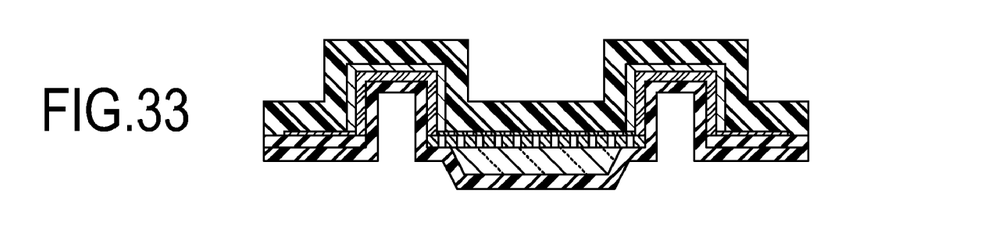

Subsequent removal of the etch stop layer 323 and conformal deposition of a second elastomer layer 340 are performed in a similar manner as described for the previous embodiments. Finally, the temporary glass carrier 334 and the adhesive layer 332 are removed.

Figure 34:
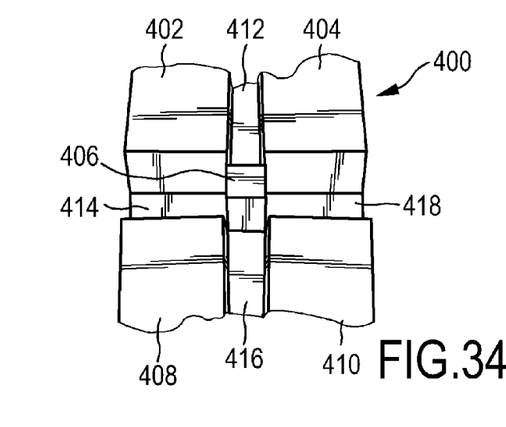
FIGS. 34-36 show schematic perspective views of an unfoldable integrated-circuit device during different phases of the unfolding motion, according to a fourth embodiment of the invention.
Figure 35:
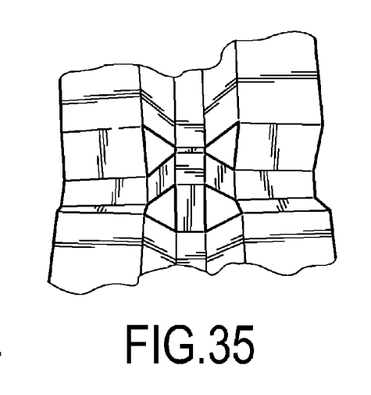
Figure 36:
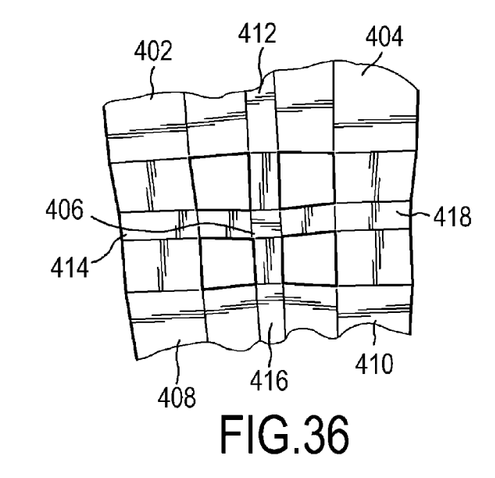

FIGS. 34-36 show a schematic perspective views of an unfoldable integrated-circuit device during different phases of unfolding, according to a fourth embodiment of the invention.

FIG. 34 shows an integrated-circuit device 400 in a schematic perspective (three-dimensional) view. The integrated-circuit device 400 has circuit islands 402 to 410, which are connected by fold structures 412 to 418. The fold structures have a cross-sectional profile in the form of a rectangle resembling the letter U (upright). FIGS. 35 and 36 show the integrated circuit device 400 during different stages of its unfolding.

Figure 37:
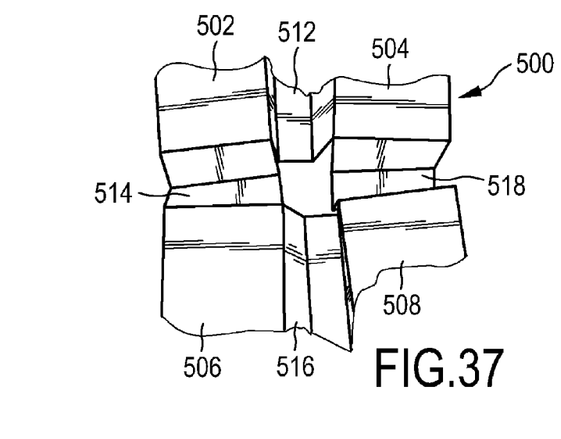
FIGS. 37-39 show schematic perspective views of an unfoldable integrated-circuit device during different phases of the unfolding motion, according to a fifth embodiment of the invention.
Figure 38:
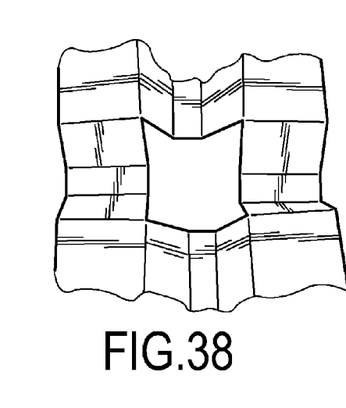
Figure 39:
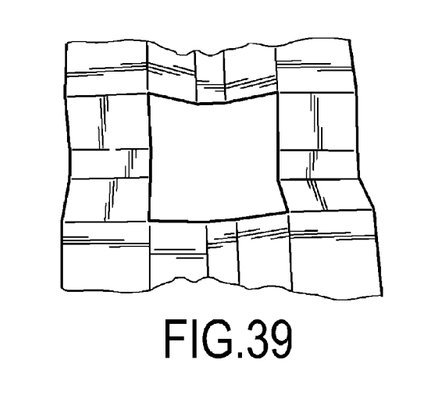

FIGS. 37-39 show a schematic view of unfoldable integrated-circuit device during different stages of unfolding, according to a fifth embodiment of the invention.

The integrated-circuit device 500 shown in FIG. 37 resembles that of FIG. 34 except for a missing circuit island 406, which somewhat modifies the fold structures 512 to 518.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single . . . or other unit may fulfill the functions of several items recited in the claims. The mere fact that certain measures are recited in mutually different dependent claims does not indicate that a combination of these measured cannot be used to advantage.

Any reference signs in the claims should not be construed as limiting the scope.

The invention claimed is:

1. An integrated-circuit device comprising:
  a substrate island having a main substrate surface with a circuit region that contains circuit elements, and comprising:
    at least one fold structure that is attached to the substrate island and that is unfoldable from a relaxed, folded state to a strained unfolded state, wherein the fold structure contains at least one passive electrical component and has in its folded state at least one surface with an area vector that includes a non-vanishing area-vector component in a direction parallel to the main substrate surface, which area-vector component is diminished or vanishes when deforming the fold structure from the folded into the unfolded state, wherein the at least one fold structure includes a conductor track sandwiched between two deformable layers.

2. The integrated-circuit device of claim 1, wherein the fold structure in its folded state has a section that in a cross sectional view resembles either the letter U or the letter V, each in either upright or inverted form.

3. The integrated-circuit device of claim 1, wherein the fold structure comprises a conductor track that is embedded in an elastically deformable material.

4. The integrated-circuit device of claim 3, wherein the conductor track is arranged in a neutral line of the fold structure with respect to a deformation from the folded to the unfolded state.

5. The integrated-circuit device of claim 1, wherein the fold structure is a free standing fold structure.

6. The integrated-circuit device of claim 1, wherein the fold structure connects the substrate island to a second substrate island.

7. The integrated-circuit device of claim 1, wherein the substrate island is sandwiched between the two deformable layers.

8. An integrated-circuit device comprising:
a substrate island having a main substrate surface with a circuit region that contains circuit elements, and comprising:
at least one fold structure that is attached to the substrate island and that is unfoldable from a relaxed, folded state to a strained unfolded state, wherein the fold structure contains at least one passive electrical component and has in its folded state at least one surface with an area vector that includes a non-vanishing area-vector component in a direction parallel to the main substrate surface, which area-vector component is diminished or vanishes when deforming the fold structure from the folded into the unfolded state, wherein the fold structure connects the substrate island and an antenna.

9. An integrated-circuit device comprising:
a substrate island having a main substrate surface with a circuit region that contains circuit elements, and comprising:
at least one fold structure that is attached to the substrate island and that is unfoldable from a relaxed, folded state to a strained unfolded state, wherein the fold structure contains at least one passive electrical component and has in its folded state at least one surface with an area vector that includes a non-vanishing area-vector component in a direction parallel to the main substrate surface, which area-vector component is diminished or vanishes when deforming the fold structure from the folded into the unfolded state, wherein a respective fold structure is attached on four lateral sides of the substrate island, and wherein the integrated-circuit device is unfoldable for expanding in four directions.

10. The integrated-circuit device of claim 1, which is mounted on a temporary carrier.

11. A method for fabricating an integrated-circuit device, comprising the steps of:
providing a rigid substrate having a main substrate surface that comprises at least one circuit region with circuit elements;
fabricating a template structure on the main substrate surface outside the circuit region, the template structure having at least one surface with an area vector that includes a non-vanishing area-vector component in a direction parallel to the main substrate surface;
depositing an etch stop layer on the template structure, the etch stop layer withstanding an agent suitable for removing material of the substrate;
fabricating a conductor track on top of the etch stop layer;
depositing a first deformable material layer on a first conductor track surface;
mounting the substrate onto a temporary carrier, the template structure facing the temporary carrier;
forming a substrate island in the circuit region and removing the substrate from a back face opposite to the side of the temporary carrier up to the etch stop layer and;
selectively removing the etch stop layer, thus exposing the conductor track;
depositing a second deformable material layer on a second conductor track surface;
removing the temporary carrier.

12. The method of claim 11, wherein the step of fabricating a template structure comprises etching a trench in the shape of either the letter U or the letter V into the main substrate surface.

13. The method of claim 12, wherein, before the step of mounting the substrate onto a temporary carrier, a step of sealing the trench is performed.

14. The method of claim 13, wherein, after the step of sealing the trench and before the step of mounting the substrate onto a temporary carrier, a step of depositing a separator layer on the substrate is performed.

15. The method of claim 14, comprising a step of removing the separator layer and the trench sealing after the step of removing the temporary carrier.

16. The method of claim 12, wherein the step of mounting the substrate onto the temporary carrier comprises depositing and planarizing an adhesive layer on the main substrate surface and in the trench.

17. The method of claim 11, wherein the step of fabricating a template structure comprises a step of fabricating an elevated template structure on the substrate surface.

18. The method of claim 11, wherein the step of providing the substrate comprises fabricating an antenna structure at a lateral distance to the circuit region.

* * * * *